United States Patent [19]
Brajder et al.

[11] Patent Number: 4,524,334
[45] Date of Patent: Jun. 18, 1985

[54] TRIANGLE WAVEFORM GENERATOR

[75] Inventors: Antonio Brajder; Klaus Hantke, both of Erlangen, Fed. Rep. of Germany

[73] Assignee: Siemens Aktiengesellschaft, Munich, Fed. Rep. of Germany

[21] Appl. No.: 491,276

[22] Filed: May 4, 1983

[30] Foreign Application Priority Data

May 26, 1982 [DE] Fed. Rep. of Germany ....... 3219815

[51] Int. Cl.³ .............................................. H03B 5/20
[52] U.S. Cl. .................................... 331/135; 331/143; 307/228; 328/181
[58] Field of Search ................ 307/228, 494; 328/127, 328/181, 184; 330/9; 331/111, 135, 143, 183

[56] References Cited

U.S. PATENT DOCUMENTS

| | | | |
|---|---|---|---|
| 3,568,086 | 3/1971 | Perry | 331/65 |
| 3,772,533 | 11/1973 | Bruckner et al. | 307/228 X |
| 3,835,419 | 9/1974 | Milne et al. | 307/228 X |
| 3,909,734 | 9/1975 | Palombo et al. | 328/184 X |
| 3,932,741 | 1/1976 | Hanson | 235/197 |
| 4,047,052 | 9/1977 | Koubek et al. | 307/228 X |
| 4,241,362 | 12/1980 | Van der Valk | 307/494 X |

OTHER PUBLICATIONS

Bishop, A., "Low Frequency Triangle Wave Generator", Wireless World, (May 76), p. 50.
Bailey, M., "Sweeping Ramp Generator Using Op Amps", Electronic Engineering, (Oct. 76), p. 27.
Orr, T., "Triangle/Square Wave Oscillator", Electronics Today International (Great Britain), v. 10, No. 11, (Nov. 81), p. 50.

Primary Examiner—Eugene R. LaRoche
Assistant Examiner—Robert J. Pascal
Attorney, Agent, or Firm—Kenyon & Kenyon

[57] ABSTRACT

A triangle waveform generator having a comparator which drives an integrator via a limiter is disclosed. At the output of the integrator, the desired triangular waveform voltage is present. The output of the integrator is connected to a first input of the comparator. The output of the comparator is fed back to its first input via a resistor. The output of the integrator is coupled via an integral action controller to a second input of the comparator. The integral action controller has a substantially longer time constant than the integrator. With this circuit, a triangular voltage is obtained, the parameters of which, namely, the slope and the positive and negative peak values, depend only on resistors and reference voltages which can be set within narrow tolerances.

3 Claims, 2 Drawing Figures

TRIANGLE WAVEFORM GENERATOR

BACKGROUND OF THE INVENTION

The present invention relates to a triangle waveform generator having a comparator circuit which drives, via a limiter, an integrator, to the output of which is connected a first input of the comparator circuit and wherein the desired triangle waveform voltage is present at the output of the integrator.

Triangle waveform generators designed in this manner are commercially available. In the known arrangements, a comparator is followed by a flip-flop circuit which delivers a positive or negative voltage. The output of the flip-flop circuit is connected to a limiter comprising a resistor and a first diode coupled to a negative reference voltage source and a second diode coupled to a second reference voltage source having opposite polarity. A voltage is present at the output of the limiter which alternates between the positive and negative reference voltages, always in addition to the corresponding diode thresholds. This voltage, determined by the reference voltages, is then fed as an input voltage to an integrator. At a comparison input is present at one time a positive and at another time a negative comparison voltage by which the output voltage of the integrator and the switching point of the flip-flop circuit are fixed. This circuit is relatively expensive since, in addition to the comparator, a flip-flop circuit as well as a switching device for the comparison voltage of the comparator are required. Furthermore, due to differences in the threshold voltages of the two diodes connected to the reference voltages, complete symmetry of the triangular voltage cannot be achieved.

Further equipment is commercially available having triangle waveform generators in which the comparator circuit is directly followed by an integrator. The switching point of the comparison voltage for the rising and falling edges of the triangular voltage is realized by feeding back, in an operational amplifier acting as a comparator, the output via a resistor to the input. In such designs, however, the positive and negative slopes of the triangle waveform are not equal because the operational amplifier serving as the comparator goes into limit drive and then has different saturation voltages for positive and negative limit drive. Due to the difference in the voltages on the positive and negative side, the positive and negative peak values of the triangular voltage are also unequal. While they can be brought into agreement by a bias applied to the comparator, this necessitates trimming the circuit.

Examples of known arrangements for triangle waveform generators include U.S. Pat. Nos. 3,568,086 and 3,932,741.

It is, therefore, an object of the present invention to provide a triangle waveform generator wherein the output triangular voltage is completely symmetrical without the need for trimming circuitry.

SUMMARY OF THE INVENTION

This and other objects of the present invention are achieved by a triangle waveform generator having comparator means, limiter means and integrating means, the comparator means having first and second inputs, a first input of the comparator means being coupled to the output of the integrating means, the output of the comparator means being coupled to the limiter means, the output of the limiter means being coupled to the input of the integrating means, the triangle waveform voltage being present at the output of the integrating means. The improvement comprises the limiter means being coupled directly to the output of the comparator means, means for coupling the output of the comparator means to the first input of the comparator means and integral action controller means having an input coupled to the output of the integrating means and an output coupled to the second input of the comparator means, the integral action controller means having a substantially longer time constant than the integrating means.

In this circuit, the positive and negative input voltage of the integrating means are therefore determined by the limiter means. The asymmetry of the triangular waveform voltage which remains due to different response points of the limiter means in the positive and negative directions is eliminated by the integral action controller means. The latter shifts the response point of the comparator means in the positive or negative direction until the sawtooth voltage has a zero mean value and is therefore symmetrical. By feeding back the output of the comparator means to its first input via a resistor, the comparison voltage of the comparator means is switched over automatically so that no separate switching device is required.

Most simply, the integral action controller means can be an operational amplifier having a capacitor connected between the output and the inverting input.

In one practical embodiment, the comparator means comprises a comparator having a collector output which is connected to a first reference voltage source and the emitter output of which is connected via a first diode to the junction point of a series circuit, the series circuit being connected between a supply voltage source and a second reference voltage source, the series circuit comprising a resistor and a second diode, wherein the polarity of the supply voltage source and of the second reference voltage source is opposite to the polarity of the first reference voltage source. Thus, one input voltage of the integrating means is determined directly by the first reference voltage source, and the second input voltage of the integrating means is determined by a limiter circuit connected to the second reference voltage source.

BRIEF DESCRIPTION OF THE DRAWINGS

The invention will be described in greater detail in the following detailed description, with reference to the drawings, in which.

DETAILED DESCRIPTION

Figure 1:
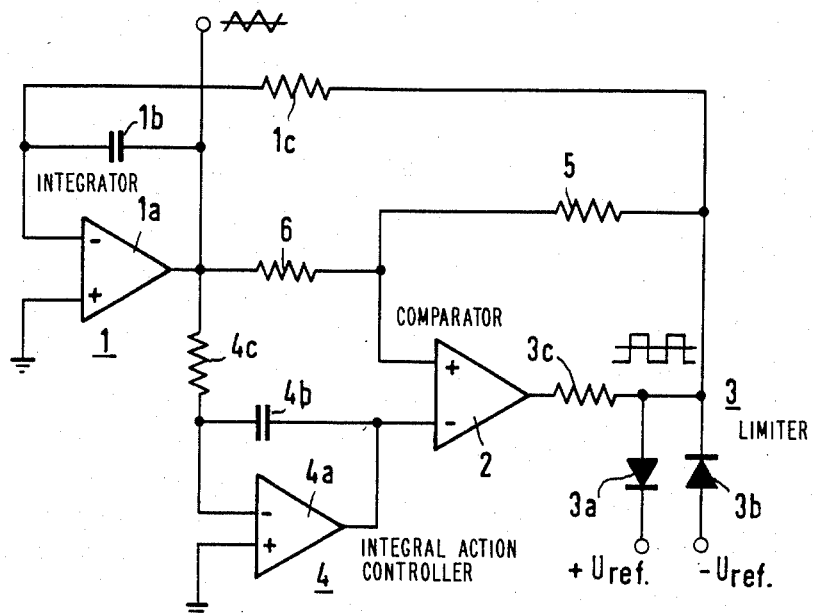
FIG. 1 is a schematic diagram of a first embodiment of the invention.

With reference now to the drawings, in the embodiment shown in FIG. 1, the integrator 1 is realized by an operational amplifier 1a, the noninverting input of which is connected to a reference potential of the circuit arrangement, and the output of which is connected via an integrating capacitor 1b to the inverting input. In addition, the output of the operational amplifier 1a is connected via a resistor 6 to the noninverting input of operational amplifier 2 which acts as a comparator. The output of operational amplifier 2 is coupled to a resistor 3c, and thence to diodes 3a and 3b. The cathode of diode 3a is coupled to a first, positive reference voltage $+U_{ref}$ and the anode of diode 3b is coupled to a second, negative reference voltage $-U_{ref}$. The anode of diode 3a and the cathode of diode 3b are connected together and to resistor 3c. Diodes 3a and 3b and resistor 3c form a limiter circuit 3. The voltage at the junction point of the reistor 3c and the diodes 3a and 3b is fed back via a resistor 5 to the noninverting input of operational amplifier 2 and is also connected via a resistor 1c to the inverting input of operational amplifier 1a. The positive and the negative reference voltage $+U_{ref}$, $-U_{ref}$ have the same magnitude, the magnitude being less than the voltage delivered by operational amplifier 2 at full drive.

If it is assumed in the circuit described so far that a positive voltage is present at the output of operational amplifier 2, the latter is integrated by the integrator 1 formed by the operational amplifier 1a, the capacitor 1b and the resistor 1c in the negative direction, i.e., the negative slope of the triangular voltage is formed at the output of integrator 1. Via resistors 5 and 6 which have the same values, the output voltage of the limiter 3 and the output voltage of the integrator 1 are summed. Operational amplifier 2 remains at the positive limit drive until the magnitude of the output voltage of the integrator 1 becomes larger than that of the output voltage of the limiter 3. As soon as the magnitude of the output voltage of the integrator 1 exceeds this value, the output of operational amplifier 2 goes into the negative limit drive. The diode 3b thus becomes conducting so that at the output of the limiter 3 a voltage appears which is equal to the negative reference voltage $-U_{ref}$ plus the threshold voltage of the diode 3b. The integrator 1 integrates this negative voltage due to its inverting effect upward so that the positive slope of the triangular voltage is present at its output. This voltage is again compared with the negative output voltage of the limiter 3. The integrator 1 continues to integrate upward until its output voltage exceeds the magnitude of the output voltage of the limiter 3. Then, the output of operational amplifier 2 flips again to positive values. The diode 3a thereby becomes conducting again so that now the positive reference voltage $+U_{ref}$ plus the threshold voltage of the diode 3a is present at the output of the limiter 3.

In the circuit described so far, the input voltage of the integrator 1 is therefore determined by the positive or negative reference voltages $+U_{ref}$, $-U_{ref}$, plus or minus the threshold value of the respective diode 3a or 3b. Similarly, the peak values of the triangular voltage, i.e., the switching points of the operational amplifier 2, are fixed by these voltages. Since the reference voltages $+U_{ref}$, $-U_{ref}$ can be set very accurately, the accuracy of the triangular waveform slopes and of the peak values of the triangular voltage depend essentially only on the threshold values of the diodes 3a and 3b and on the offset voltages of operational amplifiers 1a and 2. In order to eliminate the influence of these possibly different threshold values, an integral action controller (I-controller) 4 is coupled in the circuit arrangement shown in FIG. 1 between the output of integrator 1 and the inverting input of operational amplifier 2.

I-controller 4 comprises an operational amplifier 4a, the noninverting input of which is connected to the reference potential of the circuit arrangement and the inverting input of which is connected via a capacitor 4b to its output and via a resistor 4c to the output of integrator 1. The output of operational amplifier 4a is connected to the inverting input of operational amplifier 2.

I-controller 4 is therefore an integrating circuit also. Capacitor 4b is substantially larger than capacitor 1b integrator 1, so that I-controller 4 has a substantially longer time constant than integrator 1. The output voltage of I-controller 4 therefore practically does not follow the shape of the triangular voltage but represents only an integral of its mean value.

As long as the mean value of the triangular voltage is zero, i.e., if for a linear triangular voltage, the positive and negative peak values are equal, the output voltage of I-controller 4 is zero and the latter has no influence on the switching point of operational amplifier 2. If, on the other hand, for instance, the positive peak value of the triangular voltage is larger than its negative peak value, the mean value becomes positive. This positive mean value is integrated in the negative direction by I-controller 4 so that a negative voltage is present at the inverting input of the operational amplifier 2. The upper and lower switching points of the triangular voltage are thereby shifted downward, i.e., the positive peak value of the triangular voltage is decreased and the negative peak value of the triangular voltage is increased until both peak values are equal again and the mean value is zero. Conversely, the negative peak value is decreased in the case of a negative mean value and the positive peak value is increased until the two values are likewise equal again. By means of controller 4, the asymmetries of the triangular voltage caused by the different threshold values of diodes 3a and 3b and by the offset voltages of operational amplifiers 1a and 2 are therefore eliminated without the need for separate trimming or special selection of the diodes 3a and 3b. The positive and negative peak values of the triangular voltage therefore depend only on the tolerance of the comparison resistors 5 and 6 as well as the reference voltages $+U_{ref}$ and $-U_{ref}$. These quantities, however, can be preset within narrow tolerances.

Figure 2:
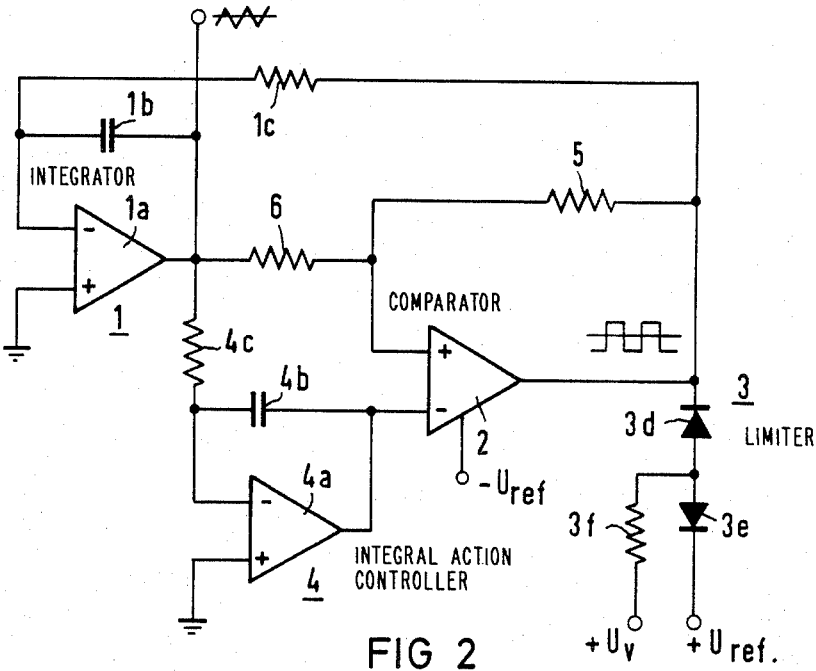
FIG. 2 is a schematic diagram of a second embodiment of the invention.

In the embodiment shown in FIG. 2, a comparator 2 having an open collector output is used, in contrast to the embodiment shown in FIG. 1, where an operational amplifier 2 is used. This open collector output is connected to the negative reference voltage $-U_{ref}$. If the sum of the input voltage values of comparator 2 is negative, the negative reference voltage $-U_{ref}$ plus the forward voltage of the output stage of comparator 2 is present at its emitter output. The output voltage therefore need no longer be limited in the negative direction, but only limitation in the positive direction is necessary. For this purpose, the series circuit of a resistor 3f and a diode 3e is provided, where one lead of the resistor is connected to a positive, unstabilized supply voltage $+U_v$ and the cathode of the diode 3e is coupled to the positive reference voltage $+U_{ref}$. The junction point of resistor 3f and diode 3e is connected via a diode 3d to the emitter output of the comparator 2, the cathode facing the emitter output of the comparator 2. If, therefore, with the sum of the input voltages of the comparator 2 positive, the output voltage of the comparator is blocked because the output transistor is biased off, the positive reference voltage $+U_{ref}$ plus the threshold voltage of the diode 3e is present at the junction point of the resistor 3f and the diode 3e. At the input of the integrator 1a, this value is present reduced by the threshold voltage of the diode 3d. If the diodes 3e and 3d have the same threshold values, the positive reference voltage $+U_{ref}$ therefore appears at the input of integrator 1a, unreduced by diode threshold voltages.

In order to equalize unequal threshold values of diodes 3d and 3e as well as the forward voltage of comparator 2, I-controller 4 is provided as in FIG. 1. A symmetrical triangular voltage is also thereby obtained by this circuit, the parameters of which depend only on resistors and reference voltages which can be provided within narrow tolerances.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a triangle waveform generator having comparator means, limiter means and integrating means, the comparator means having first and second inputs, a first input of said comparator means being coupled to the output of said integrating means, the output of said comparator means being coupled to said limiter means, the output of said limiter means being coupled to the input of said integrating means, the triangle waveform voltage being present at the output of said integrating means, the improvement comprising:

said limiter means being coupled directly to the output of said comparator means;

means for coupling the output of said comparator means to the first input of said comparator means; and integral action controller means having an input coupled to the output of said integrating means, the output of said integral action controller means being coupled to the second input of said comparator means, said integral action controller means having a substantially longer time constant than said integrating means, whereby said integral action controller means compensates for asymmetries in the triangular waveform caused by said limiter means.

2. The improvement recited in claim 1, wherein:

said comparator means comprises a comparator having a collector output coupled to a first reference voltage source, and an emitter output; and said limiter means comprises:

a first diode coupled to said emitter output;

a series circuit comprising a resistor and a second diode, said series circuit coupled between a supply voltage source and a second reference voltage source, said supply voltage source and said second reference voltage source being opposite in polarity to said first reference voltage source, the junction point of said resistor and said second diode being coupled to said first diode, said first and second diodes having like terminals coupled together.

3. In a triangle waveform generator having comparator means, limiter means and integrating means, the comparator means having first and second inputs, a first input of said comparator means being coupled to the output of said integrating means, the output of said comparator means being coupled to said limiter means, the output of said limiter means being coupled to the input of said integrating means, the triangle waveform voltage being present at the output of said integrating means, the improvement comprising:

said limiter means being coupled directly to the output of said comparator means;

means for coupling the output of said comparator means to the first input of said comparator means; and integral action controller means having an input coupled to the output of said integrating means, the output of said integral action controller means being coupled to the second input of said comparator means, said integral action controller means having a substantially longer time constant than said integrating means;

said comparator means comprising a comparator having a collector output coupled to a first reference voltage source, and an emitter output; and said limiter means comprising:

a first diode coupled to said emitter output;

a series circuit comprising a resistor and a second diode, said series circuit coupled between a supply voltage source and a second reference voltage source, said supply voltage source and said second reference voltage source being opposite in polarity to said first reference voltage source, the junction point of said resistor and said second diode being coupled to said first diode, said first and second diodes having like terminals coupled together, whereby said second reference voltage appears, depending on voltages appearing at the inputs of said comparator means, at the output of said comparator means substantially unaffected by the voltage drops due to said first and second diodes.

* * * * *